US009106242B2

(12) United States Patent
Gomez et al.

(10) Patent No.: US 9,106,242 B2
(45) Date of Patent: Aug. 11, 2015

(54) DIGITAL CORRECTION TECHNIQUES FOR DATA CONVERTERS

(71) Applicant: Broadcom Corporation, Irvine, CA (US)

(72) Inventors: Ramon Gomez, San Juan Capistrano, CA (US); Loke Tan, Newport Coast, CA (US); Bruce Currivan, Lost Altos, CA (US); Steven Jaffe, Irvine, CA (US); Thomas Kolze, Phoenix, AZ (US); Lin He, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 150 days.

(21) Appl. No.: 13/867,580

(22) Filed: Apr. 22, 2013

(65) Prior Publication Data

US 2013/0314261 A1 Nov. 28, 2013

Related U.S. Application Data

(63) Continuation of application No. 13/228,301, filed on Sep. 8, 2011, now Pat. No. 8,564,462.

(60) Provisional application No. 61/380,801, filed on Sep. 8, 2010, provisional application No. 61/449,949, filed on Mar. 7, 2011.

(51) Int. Cl.
*H03M 1/06* (2006.01)
*H03M 1/10* (2006.01)
(Continued)

(52) U.S. Cl.
CPC ............... *H03M 1/06* (2013.01); *H03M 1/1061* (2013.01); *H03M 1/00* (2013.01); *H03M 1/0695* (2013.01); *H03M 1/12* (2013.01); *H03M 1/1215* (2013.01)

(58) Field of Classification Search
CPC ........ H03M 1/00; H03M 1/12; H03M 1/0695
USPC .......................... 341/118, 119, 120, 155, 161
See application file for complete search history.

(56) References Cited

U.S. PATENT DOCUMENTS

| 6,339,390 B1 | 1/2002 | Velazquez et al. |
| 7,161,514 B2 | 1/2007 | Tamba |

(Continued)

OTHER PUBLICATIONS

El-Chammas, et al., "A 12-GS/s 81-mW 5-bit Time-Interleaved Flash ADC With Background Timing Skew Calibration," IEEE-Journal of Solid State Circuits, vol. 46, No. 4 (Apr. 2011); 10 pages.

(Continued)

*Primary Examiner* — Joseph Lauture
(74) *Attorney, Agent, or Firm* — Sterne, Kessler, Goldstein & Fox P.L.L.C.

(57) ABSTRACT

A method and apparatus is disclosed to compensate for impairments within a data converter such that its output is a more accurate representation of its input. The data converter includes a main data converter, a reference data converter, and a correction module. The main data converter may be characterized as having the impairments. As a result, the output of the main data converter is not the most accurate representation of its input. The reference data converter is designed such that the impairments are not present. The correction module estimates the impairments present within the main data converter using its output and the reference data converter to generate corrections coefficients. The correction module adjusts the output of the main data converter using the corrections coefficients to improve the performance of the data converter.

20 Claims, 11 Drawing Sheets

(51) Int. Cl.
*H03M 1/12* (2006.01)
*H03M 1/00* (2006.01)

(56) References Cited

U.S. PATENT DOCUMENTS

| | | | |
|---|---|---|---|
| 7,301,486 | B2 | 11/2007 | Wang et al. |
| 7,394,415 | B2 | 7/2008 | Fuse et al. |
| 7,782,235 | B1 | 8/2010 | Velazquez |
| 7,889,111 | B2 | 2/2011 | Kawahito |
| 7,948,409 | B2 | 5/2011 | Wu et al. |
| 8,102,289 | B2 * | 1/2012 | Oshima et al. ............... 341/120 |
| 8,519,875 | B2 | 8/2013 | Straayer et al. |
| 8,564,462 | B2 | 10/2013 | Gomez et al. |
| 8,576,102 | B2 | 11/2013 | Debnath et al. |
| 8,587,460 | B2 | 11/2013 | Noguchi et al. |
| 2004/0086137 | A1 * | 5/2004 | Yu et al. ..................... 381/71.11 |
| 2007/0069937 | A1 * | 3/2007 | Balakrishnan et al. ....... 341/161 |
| 2007/0171116 | A1 | 7/2007 | Fuse et al. |
| 2008/0024338 | A1 | 1/2008 | Huang et al. |
| 2010/0117878 | A1 | 5/2010 | Sheng et al. |
| 2010/0253557 | A1 | 10/2010 | Kidambi |
| 2011/0001645 | A1 | 1/2011 | Messier et al. |
| 2011/0128171 | A1 | 6/2011 | Oshima et al. |
| 2011/0193732 | A1 | 8/2011 | Sestok et al. |
| 2012/0050079 | A1 | 3/2012 | Goldman et al. |
| 2012/0235841 | A1 | 9/2012 | Gomez et al. |
| 2012/0262318 | A1 | 10/2012 | Straayer et al. |
| 2014/0002284 | A1 | 1/2014 | Tan et al. |

OTHER PUBLICATIONS

Korean office action directed to related KR application No. 10-2013-0071618, dated Jul. 8, 2014, from Korean Intellectual Property Office; 6 pages.
US 8,427,349, 04/2013, Gomez et al. (withdrawn)

* cited by examiner

DIGITAL CORRECTION TECHNIQUES FOR DATA CONVERTERS

CROSS-REFERENCE TO RELATED APPLICATIONS

The present application claims is a continuation of U.S. patent application Ser. No. 13/228,301, filed Sep. 8, 2011, which claims the benefit of U.S. Provisional Patent Appl. No. 61/380,801, filed Sep. 8, 2010, and U.S. Provisional Patent Appl. No. 61/449,949, filed Mar. 7, 2011, each of which is incorporated by reference herein in its entirety.

BACKGROUND

1. Field of Invention

The present invention relates generally to a data converter and specifically to compensation of impairments present within the data converter.

2. Related Art

Data converters are frequently used in mixed-signal electronic systems. Mixed signal electronic systems include both analog signal environments and digital signal environments. The analog signal environments primarily operate upon analog signals while the digital signal environments primarily operate upon digital signals. A mechanism is required to transport signals from one environment, such as the analog signal environment, to another environment, such as the digital signal environment. Commonly, an analog-to-digital converter (ADC) is used to convert analog signals from the analog signal environment to digital signals for the digital signal environment. Similarly, a digital-to-analog converter (DAC) is used to convert digital signals from the digital signal environment to analog signals for the analog, signal environment. The ADC and the DAC are commonly referred to as data converters.

Advances in integrated circuit (IC) technology have generally made it advantageous to shift more of the signal processing burden to digital circuits, and therefore there is a continuing requirement for data converters with better performance. Data converters are typically characterized primarily by two measures: sampling rate and effective-number-of-bits (ENOB). The sampling rate for the ADC represents a rate at which an input analog signal is sampled and quantized into a digital signal. For an ADC, ENOB is a measure of how accurately the input analog signal is converted into digital form. It is a combined measure that includes quantization noise, thermal noise, distortion, sampling jitter and other imperfections.

The sampling rate for the DAC represents a rate at which input digital data samples are converted into an analog output voltage or current. For a DAC, ENOB is a measure of how accurately the input digital samples are converted into analog form. It similarly is a combined measure including all imperfections. There may be differences in the application-specific definition of ENOB based on the relative importance of different imperfections in a given system. Often, the signal-to-noise (SNR) and signal-to-distortion (SDR) ratios are given in addition to ENOB.

In addition to these performance measures, it is desirable for data converters to dissipate as little DC power as possible and to cost as little as possible. These are universal goals in all electronic systems. In the mixed-signal electronic systems, low cost is related to low die area. In other words, it is desirable that the data converter design have as small an area footprint as possible within a die that forms the mixed-signal electronic system.

Conventional approaches to data converter design have emphasized analog techniques to obtain high sample rate and high ENOB. Often, these analog techniques will require high power dissipation. In general, analog circuits with high dynamic range (low noise and low distortion) require large power dissipation. High ENOB converters often require precise component matching to obtain high resolution (low quantization noise). Matching of components (transistors, resistors and capacitors) in an IC usually implies large die area. Large components match better than small ones since random fluctuations are averaged spatially.

Thus, there is a need for a data converter that leverages digital signal processing techniques to correct analog imperfections and relaxes stringent analog specifications that lead to high power dissipation and high cost that overcomes the shortcomings described above. Further aspects and advantages of the present invention will become apparent from the detailed description that follows.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

Figure 5A:
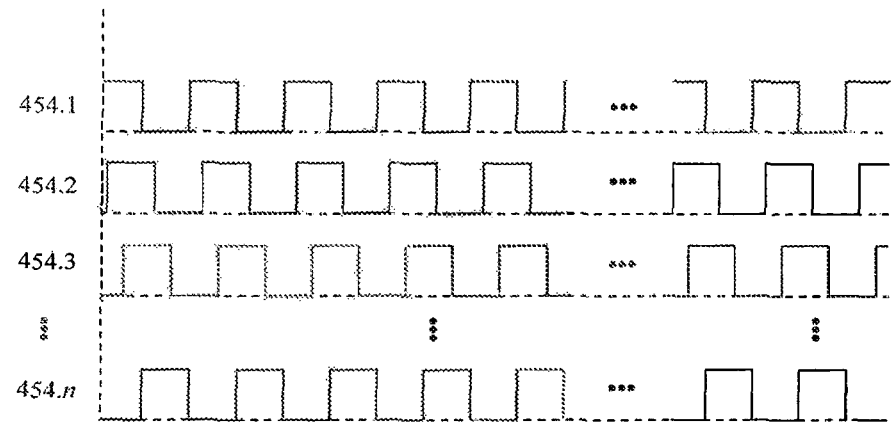
Figure 5B:
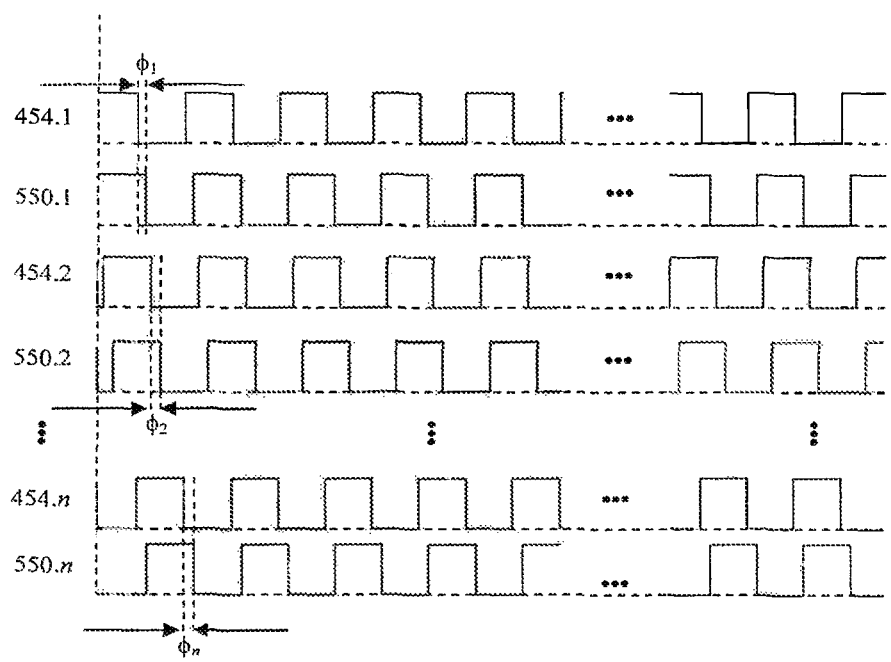
Figure 6A:
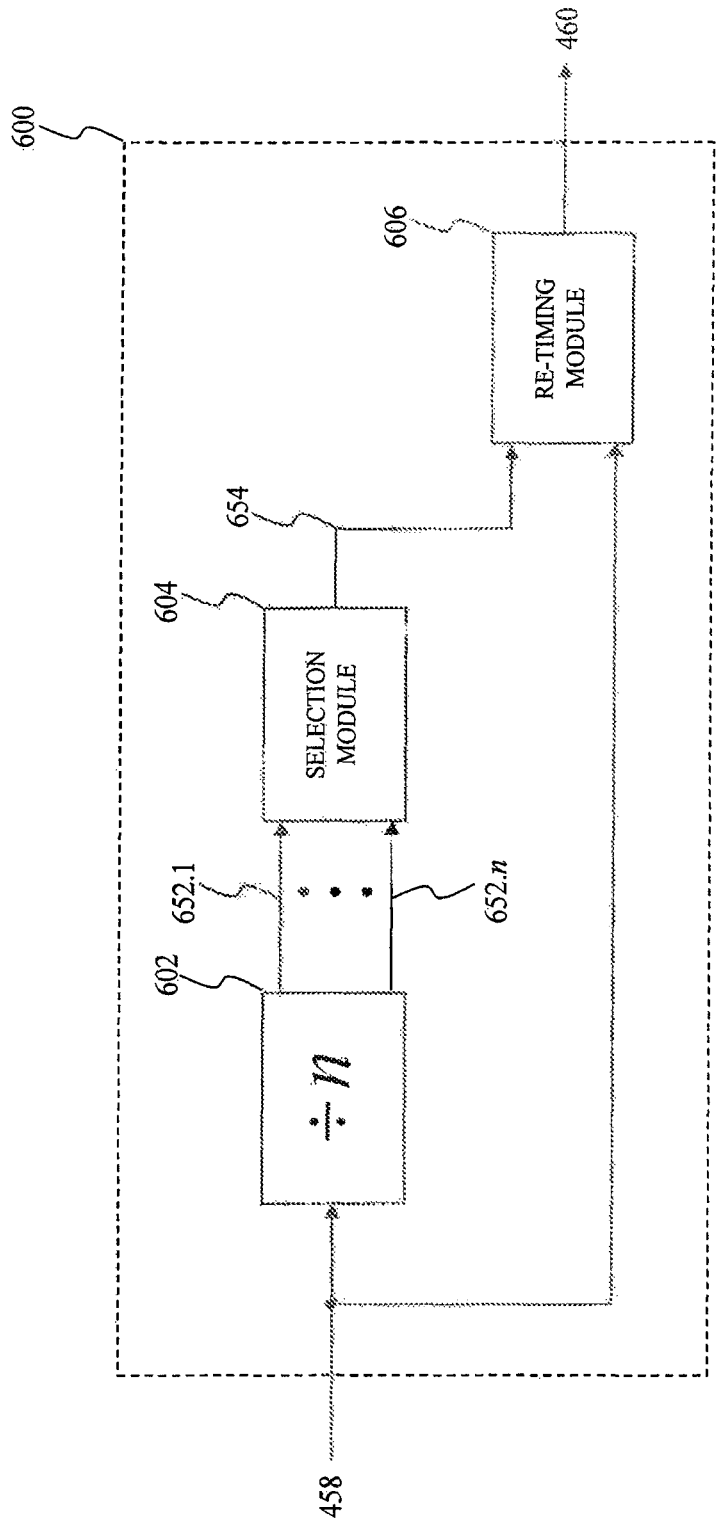
Figure 6B:
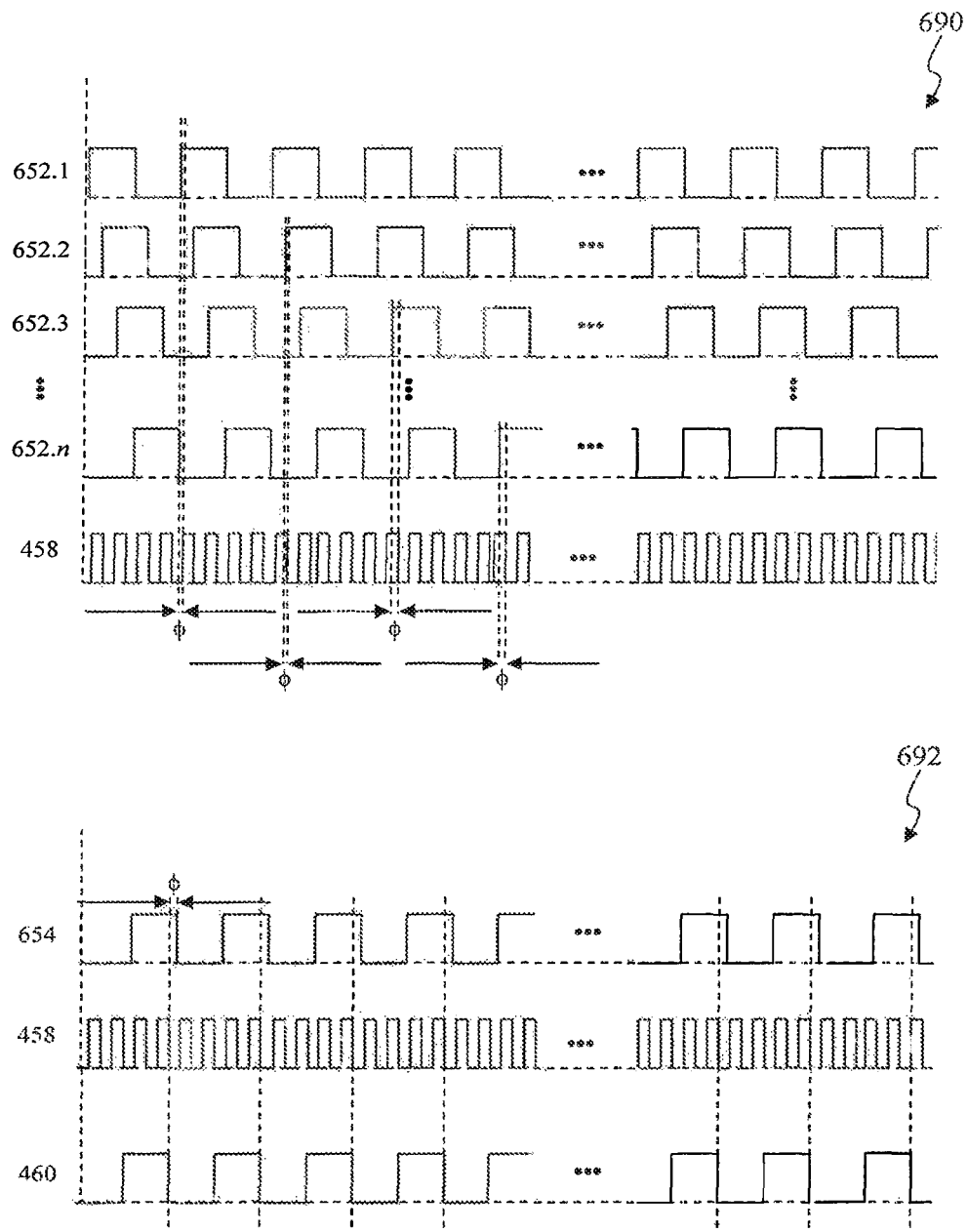
Figure 7:
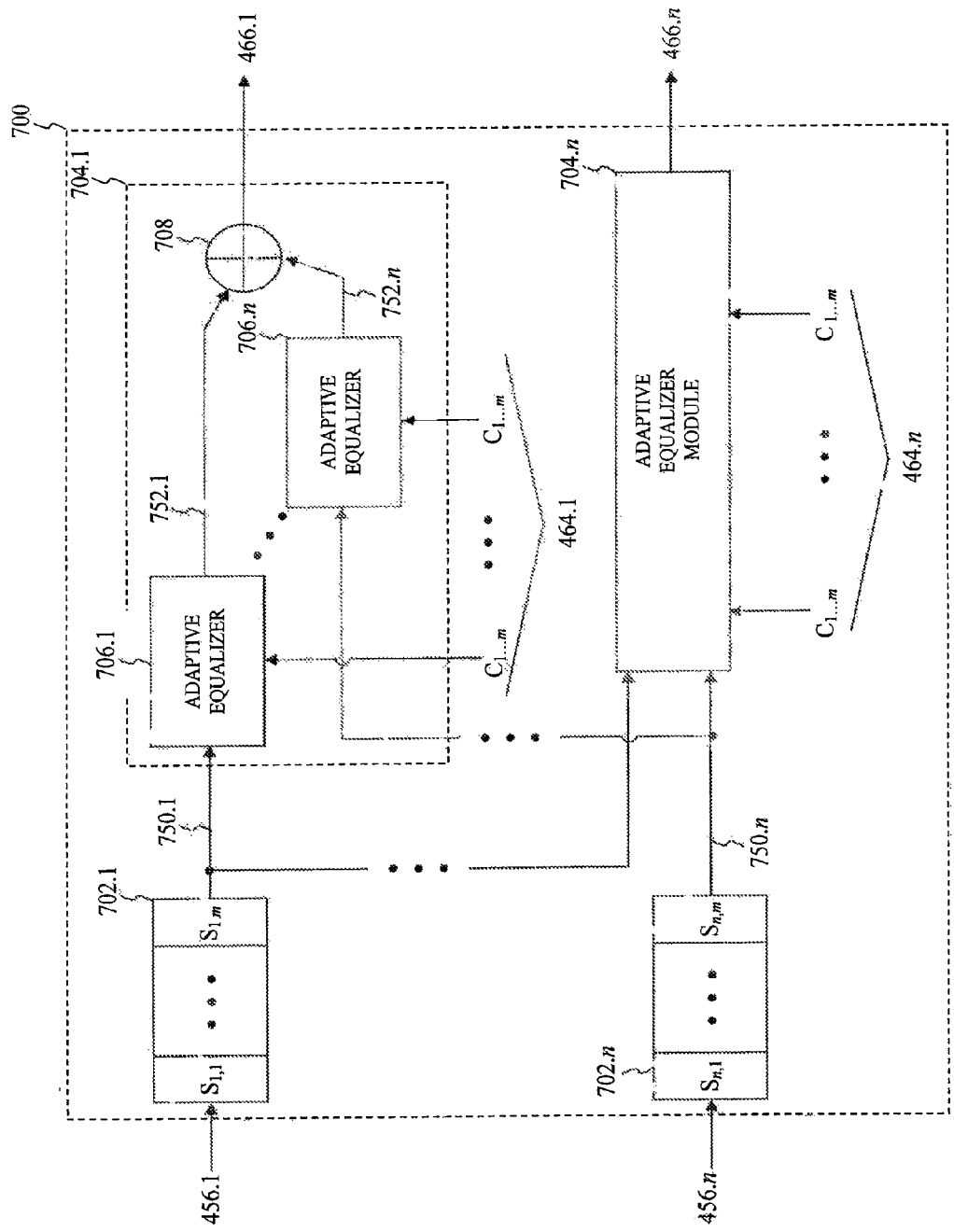
Figure 8:
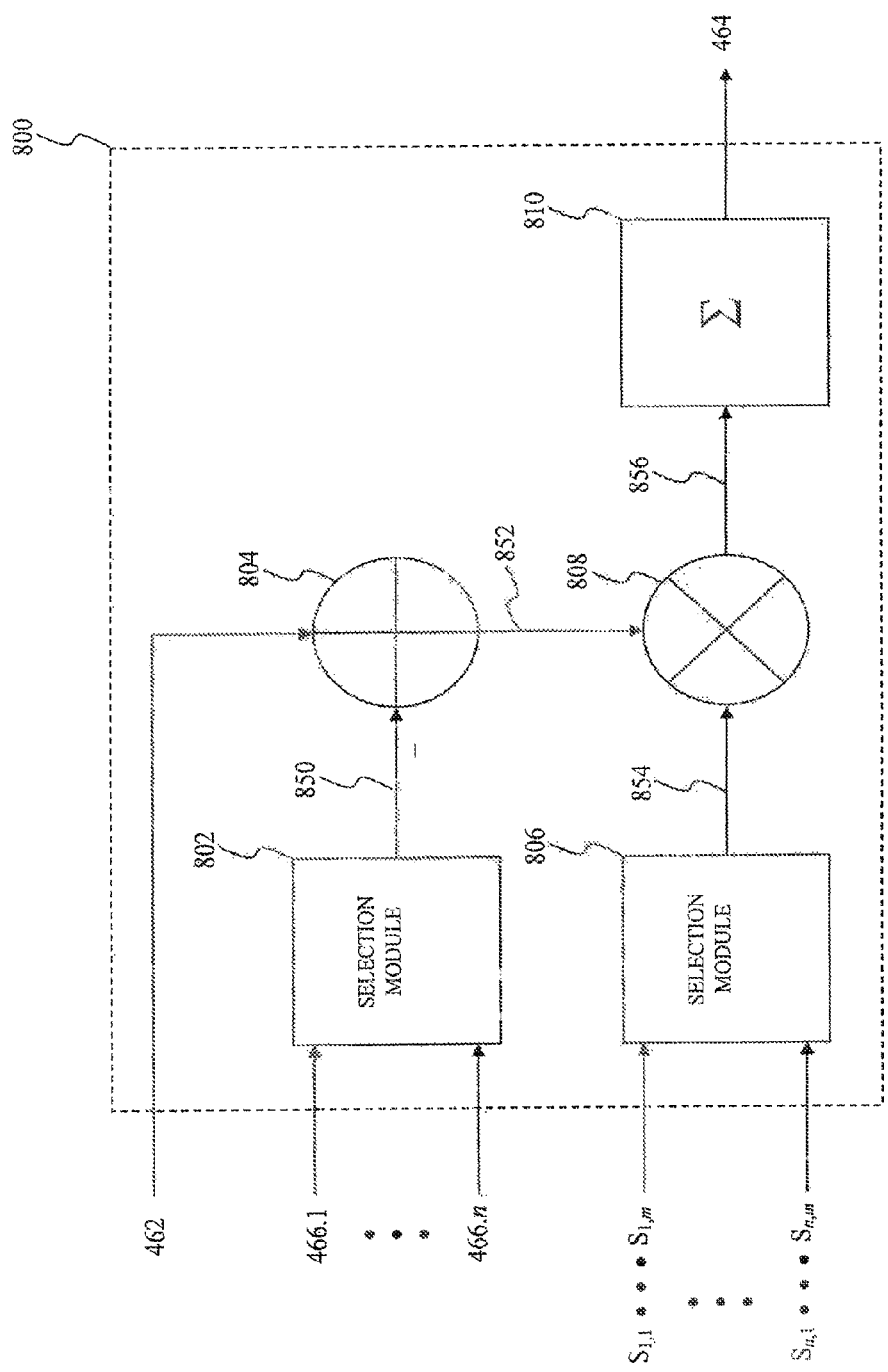
Figure 9:
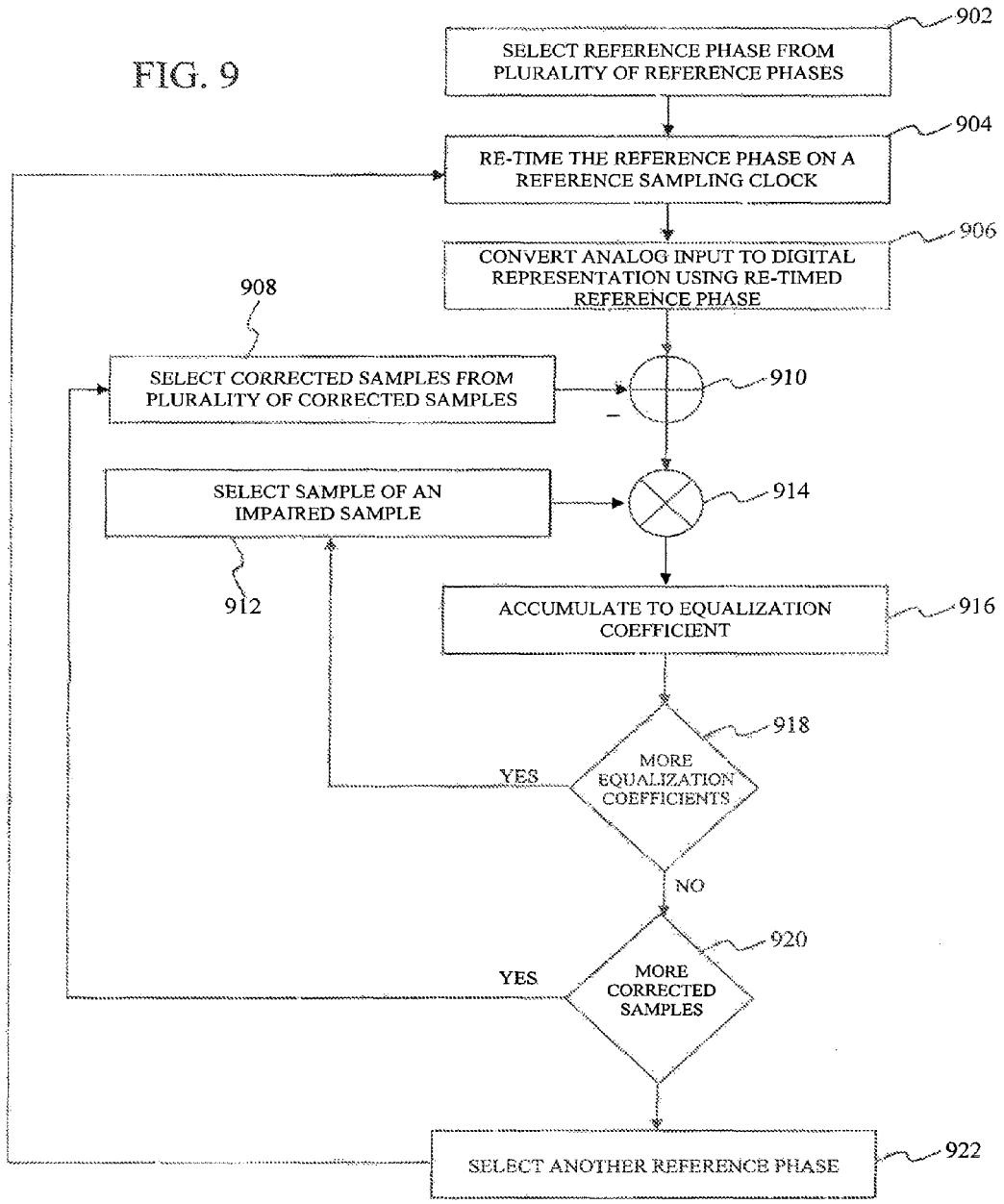
Figure 10:
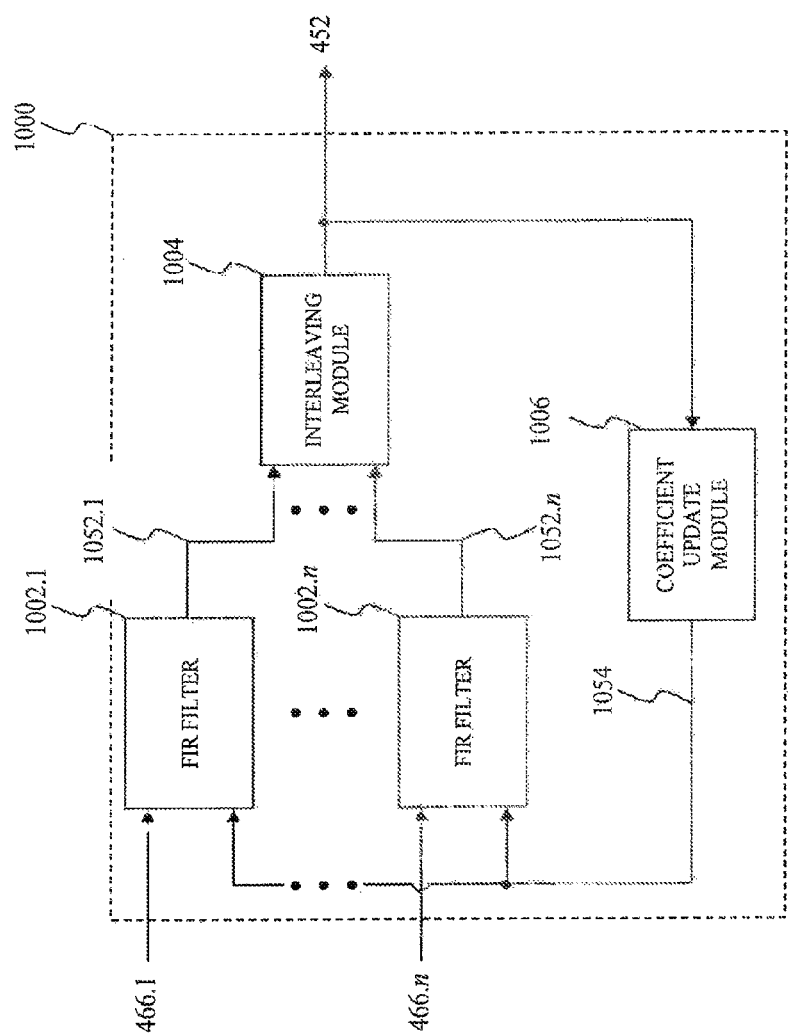

FIG. 5A graphically illustrates multiple phases of a sampling clock used in the second composite ADC according to an exemplary embodiment of the present invention;

FIG. 5B graphically illustrates unknown offsets between multiple phases of the sampling clock used in the second composite ADC according to an exemplary embodiment of the present invention;

FIG. 6A illustrates a block diagram of a reference re-timing module used in the second composite ADC according to an exemplary embodiment of the present invention;

FIG. 6B graphically illustrates operation of the reference re-timing module according to an exemplary embodiment of the present invention;

FIG. 7 illustrates a block diagram of a compensation module used in the second composite ADC according to an exemplary embodiment of the present invention;

FIG. 8 illustrates a block diagram of an estimation module used in the second composite ADC according to an exemplary embodiment of the present invention;

FIG. 9 is a flowchart of exemplary operational steps of the reference re-timing module, the compensation module, and the estimation module according to an exemplary embodiment of the present invention; and FIG. 10 illustrates a block diagram of a recombination module used in the second composite ADC according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning, and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

An Exemplary Embodiment of a First Composite Analog-to-Digital Converter (ADC)

Figure 1:
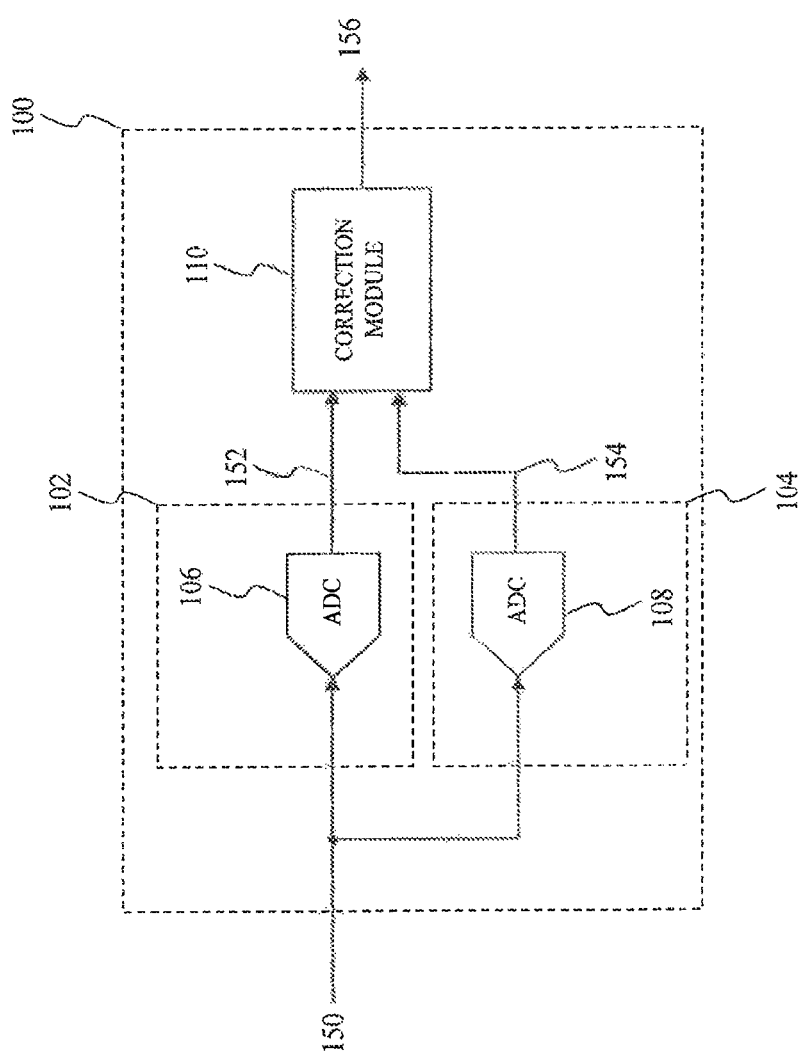
FIG. 1 illustrates a block diagram of a composite analog-to-digital converter (ADC) according to an exemplary embodiment of the present invention.

FIG. 1 illustrates a block diagram of a composite analog-to-digital converter (ADC) according to an exemplary embodiment of the present invention. A composite ADC 100 converts an analog input 150 from a first signal domain, such as an analog signal domain to provide an example, to a second signal domain, such as a digital signal domain to provide an example. The composite ADC 100 includes a main data converter 102, a reference data converter 104, and a correction module 110.

The main data converter 102 converts the analog input 150 from the analog signal domain to the digital signal domain to provide main digital samples 152. The main data converter 102 may be characterized as being, impaired by one or more impairments, such as non-linearity, direct current (DC) offset, gain, any other suitable impairment that will be apparent to those skilled in the relevant art(s) without departing from the spirit and scope of the present invention, or any combination thereof. These one or more impairments may cause the main digital samples 152 to no longer be an accurate representation of the analog input 150. In an exemplary embodiment, the main data converter 102 may be implemented using a main ADC 106.

The reference data converter 104 may be characterized as not being impaired by the one or more impairments that are present within the main data converter 102. The reference data converter 104 converts the analog input 150 from the analog signal domain to the digital signal domain to provide reference digital samples 154. Generally, the reference data converter 104 is only required to be highly accurate only with respect to the one or more impairments present in the main data converter 102; however, the reference data converter 104 may exhibit other impairments that will be apparent to those skilled in the relevant art(s) without departing from the spirit and scope of the present invention. For example, to compensate for linearity, the reference data converter 104 must be very linear, but the reference data converter 104 may exhibit other impairments, such a low signal to noise ratio (SNR) to provide an example. In an exemplary embodiment, the reference data converter 104 may be implemented using a reference ADC 108. In another exemplary embodiment, the reference ADC 108 may be characterized as being less complicated to implement when compared to the main ADC 106. For example, the reference ADC 108 may sample the analog input 150 at a different sampling rate and/or a different resolution than the main ADC 106.

A correction module 110 compensates for the effect of the one or more, impairments that are present within the main data converter 102 to provide corrected digital samples 156. The correction module 110 estimates the effect of the one or more impairments present within the main data converter 102 based upon the reference digital samples 154 to determine correction parameters. The correction parameters may be used to compensate for one or more impairments present within the main data converter 102. The correction module 110 adjusts the main digital samples 152 based upon the correction parameters to provide the corrected digital samples 156.

An Exemplary Embodiment of a Correction Module Used in the First Composite ADC

Figure 2:
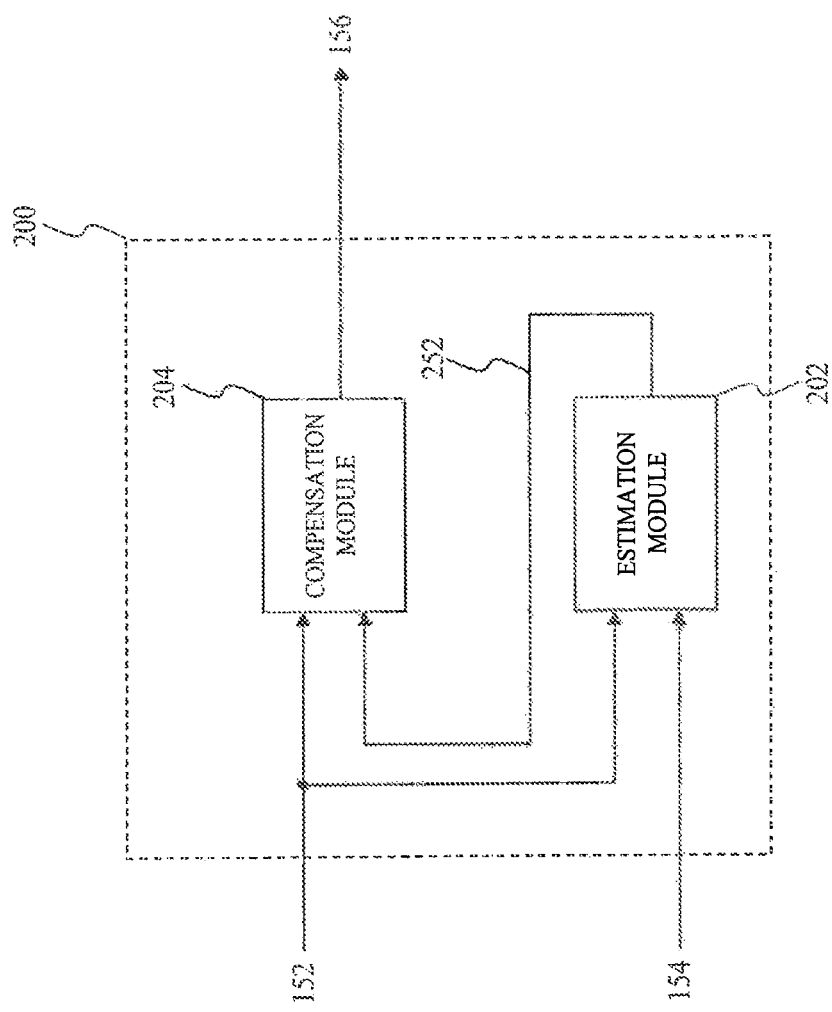
FIG. 2 illustrates a block diagram of a correction module used in the first composite ADC according to an exemplary embodiment of the present invention.

FIG. 2 illustrates a block diagram of a correction module used in the first composite ADC according to an exemplary embodiment of the present invention. A correction module 200 estimates and compensates for the one or more impairments present within the main data converter 102 to provide the corrected digital samples 156. The correction module 200 includes an estimation module 202 and a compensation module 204. The correction module 200 may represent an exemplary embodiment of the correction module 110.

The estimation module 202 estimates the one or more impairments present within the main data converter 102. The estimation module 202 may quantify the one or more impairments present within the main data converter 102 and/or the effect of the one or more impairments within the main digital samples 152 according to a mathematical model or any other suitable representation that will be apparent to those skilled in the relevant art(s) without departing from the spirit and scope of the present invention. The mathematical model represents a mathematical relationship, such as set of linear and/or non-linear difference equations to provide an example, of the one or more impairments with one or more unknown parameters. The estimation module 202 uses the mathematical model to provide solutions for the one or more unknown parameters of the mathematical model as correction parameters 252.

The estimation module 202 may map one or more samples from among the main digital samples 152 and/or one or more samples from among the reference digital samples 154 as one or more points on a Cartesian coordinate system. The one or more points on the Cartesian coordinate system may be used to develop the mathematical model. The estimation module 202 may determine a statistical relationship between the one or more points on the Cartesian coordinate system. In an exemplary embodiment, the estimation module 202 may determine a line of best fit for the one or more points on the Cartesian coordinate system. In another exemplary embodiment, the estimation module 202 may statistically determine a suitable curve, such as a quadric polynomial, a cubic polynomial, a higher-ordered polynomial, or any combination thereof to provide some examples, of best fit for the one or more points on the Cartesian coordinate system which may indicate a presence of a higher order distortion term. The estimation module 202 may use the line of best fit and or the suitable curve of best fit to determine solutions for the one or more unknown parameters of the mathematical model. The estimation module 202 provides the solutions for the one or more unknown parameters of the mathematical model as the correction parameters 252.

Alternatively, the estimation module 202 may compare the reference digital samples 154 and the corrected digital samples 156 to provide an impairment error representing an estimate of the one or more impairments present within the main data converter 102. The estimation module 202 may generate the correction parameters 252 which minimize this impairment error. The estimation module 202 may generate the correction parameters using the Least Mean Squared (LMS), Recursive Least Squares (RLS), Minimum Mean Squared Error (MMSE) algorithms or any suitable algorithm that yields a result which minimizes an error quantified by some metric, such as a minimum-mean-square error to provide an example, that will be apparent to those skilled in the relevant art(s) without departing from the spirit and scope of the present invention.

In another alternate, the estimation module 202 may estimate the effect of the one or more impairments present in the main digital samples 152 by using a statistical comparison, such as a correlation, cross-correlation, autocorrelation, and/or any other suitable statistical comparison that will be apparent to those skilled in the relevant art(s) from the teachings herein, of the main digital samples 152, the reference digital samples 154, and/or the corrected digital samples 156. For example, the estimation module 202 may determine a correlation between more than one sample from among the main digital samples 152 and generate the correction parameters 252 based upon this correlation.

The compensation module 204 adjusts the main digital samples 152 based upon the correction parameters 252 to provide the corrected digital samples 156. For example, the compensation module 204 may be implemented using one or more adaptive filters. The one or more adaptive filters may adapt their impulse responses by updating one or more adaptive filtering coefficients in response to the correction parameters 252. The one or more adaptive filtering coefficients may be updated through a least-squares algorithm, such as the widely known Least Mean Squared (LMS), Recursive Least Squares (RLS), Minimum Mean Squared Error (MMSE) algorithms or any suitable equivalent algorithm that yields an optimized result that will be apparent to those skilled in the relevant art(s) without departing from the spirit and scope of the present invention. In an exemplary embodiment, the compensation module 204 may interpolate or average between samples of the main digital samples 152 to align in time the reference digital samples 154 and the corrected digital samples 156. For, example, the main ADC 106 and the reference ADC 108 may sample the analog input 150 at differing rates. In this example, the compensation module 204 may interpolate one or more samples of the main digital samples 152 to align in time the reference digital samples 154 and the corrected digital samples 156.

An Exemplary Embodiment of a Composite Digital-to-Analog Converter (DAC)

Figure 3:
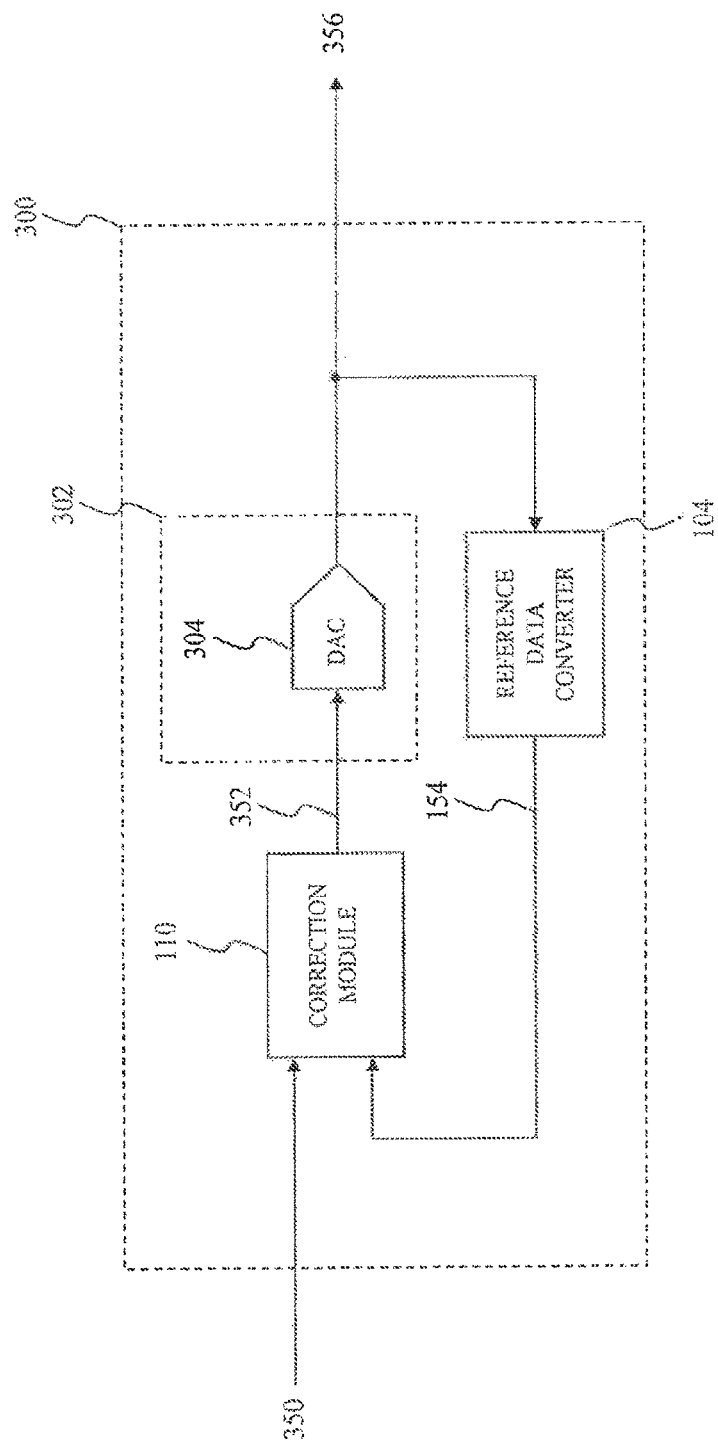
FIG. 3 illustrates a block diagram of a composite digital-to-analog converter (DAC) having a reference data converter according to an exemplary embodiment of the present invention.

FIG. 3 illustrates a block diagram of a composite digital-to-analog converter (DAC) having a reference data converter according to an exemplary embodiment of the present invention. A composite DAC 300 converts digital input samples 350 from a first signal domain, such as a digital signal domain to provide an example, to a second signal domain, such as an analog signal domain. The composite DAC 300 includes the reference data converter 104, the correction module 110, and a main data converter 302. The composite DAC 300 shares many substantially similar features as the composite ADC 100; therefore, only differences between the composite ADC 100 and the composite DAC 300 are to be described in further detail.

The main data converter 302 converts corrected digital input samples 352 from the digital signal domain to the analog signal domain to provide an analog output 356. The main data converter 302 may be characterized as being impaired by one or more impairments, such as non-linearity, direct current (DC) offset, gain, any other suitable impairment that will be apparent to those skilled in the relevant art(s) without departing from the spirit and scope of the present invention, or any combination thereof. These one or more impairments may cause the analog output 356 to no longer be an accurate representation of the digital input samples 350. In an exemplary embodiment, the main data converter 302 may be implemented using a digital to analog converter (DAC) 304.

The reference data converter 104 may be characterized as not being impaired by the one or more impairments. The reference data converter 104 converts the analog output 356 from the analog signal domain to the digital signal domain to provide the reference digital samples 154.

The correction module 110 compensates for the effect of the one or more impairments that are present within the main data converter 302 to provide the digital input samples 352.

An Exemplary Embodiment of a Second Composite Analog-to-Digital Converter (ADC)

Figure 4:
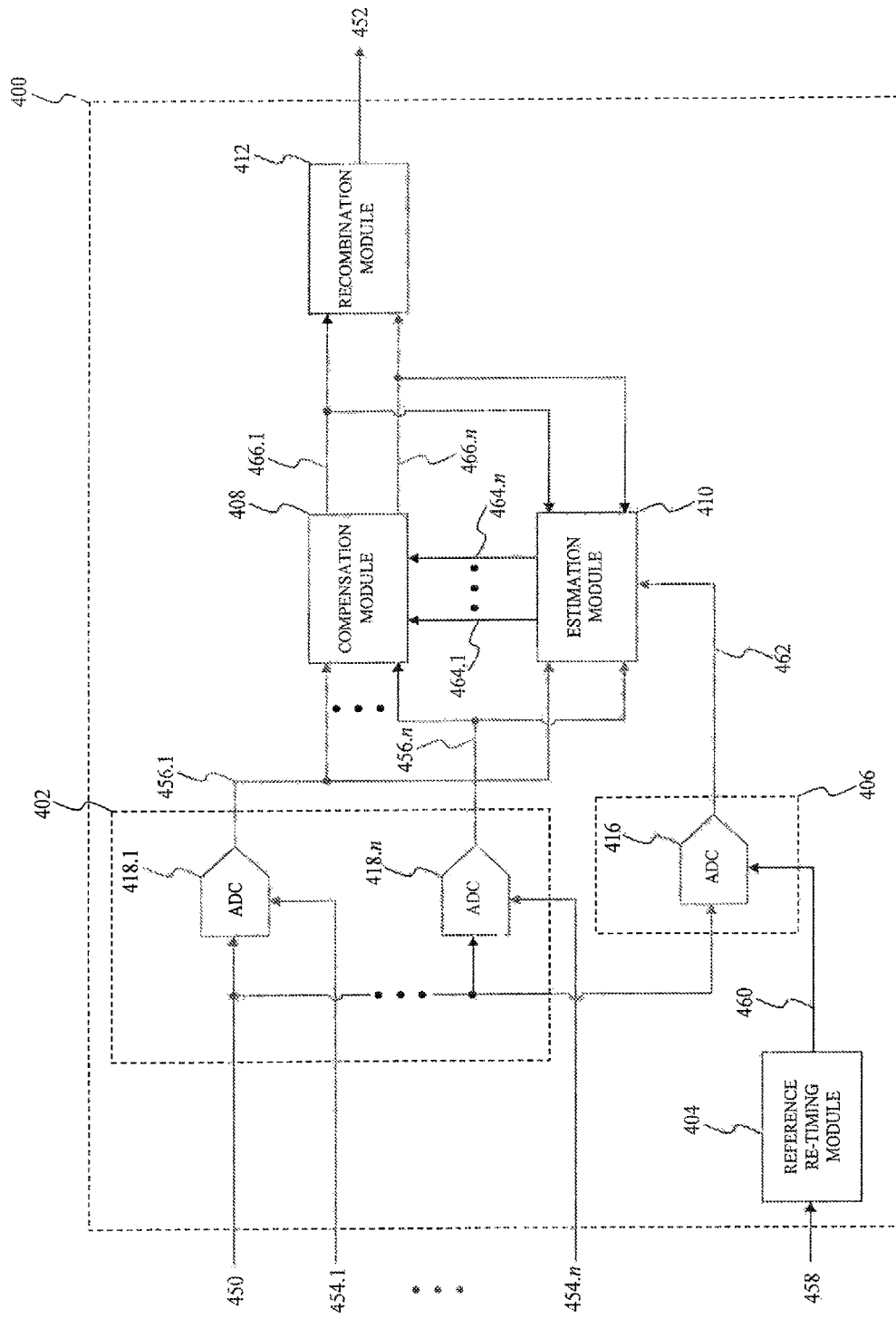
FIG. 4 illustrates a block diagram of a second composite analog-to digital converter (ADC) having a reference data converter according to an exemplary embodiment of the present invention.

FIG. 4 illustrates a block diagram of a second composite analog-to-digit converter (ADC) having a reference data converter according to an exemplary embodiment of the present invention. A composite ADC 400 converts an analog input 450 from a first signal domain, such as an analog signal domain to provide an example, to a second signal domain, such as a digital signal domain to provide an example. The composite ADC 400 utilizes multiple phases of a sampling clock to sample the analog input 450, converts these samples from the analog signal domain to the digital signal domain, and recombines these digital samples to produce digital output samples 452. However, unknown offsets between the multiple phases of the sampling clock, as well as other impairments, such as the one or more impairments as described above, may cause the digital output samples 452 to no longer accurately represent the analog input 450. The composite ADC 400 compensates for these unknown offsets such that the digital output samples 452 more accurately represent the analog input 450 in the digital signal domain. The composite ADC 400 includes a main data converter 402, a reference re-timing module 404, a reference data converter 406, a compensation module 408, an estimation module 410, and a recombination module 412.

The main data converter 402 includes main ADCs 418.1 through 418.*n* to convert the analog input 450 from the analog signal domain to the digital signal domain based upon multiple phases 454.1 through 454.*n* of a sampling clock to provide main digital samples 456.1 through 456.*n*. The main ADCs 418.1 through 418.*n* convert the analog input 450 from the analog signal domain to the digital signal domain based upon the multiple phases 454.1 through 454.*n* of the sampling clock to provide the main digital samples 456.1 through 456.*n*. For example, the main ADC 418.1 converts the analog input 450 from the analog signal domain to the digital signal domain based upon the multiple phase 454.1 of the sampling clock to provide the main digital samples 456.1. Specifically, the main ADCs 418.1 through 418.*n* sample the analog input 450 according to its corresponding multiple phase 454.1 through 454.*n* of the sampling clock. For example, the main ADCs 418.1 through 418.*n* sample the analog input 450 when its corresponding multiple phase 454.1 through 454.*n* of the sampling clock is characterized as being at a logical one or any other suitable logical level that will be apparent to those skilled in the relevant art(s) without departing from the spirit and scope of the present invention. The main ADCs 418.1 through 418.*n* convert this sampled representation of the analog input 450 from the analog signal domain to, the digital signal domain to provide the main digital samples 456.1 through 456.*n*.

In an exemplary embodiment, the main data converter 402 is implemented using main ADCs 418.1 through 418.4. The main ADCs 418.1 through 418.4 convert the analog input 450 using multiple phases 454.1 through 454.4 of the sampling clock, the multiple phases 454.1 through 454.4 of the sampling clock being offset in phase from each other by $$\frac{\pi}{2}.$$

However, this example is not limiting, those skilled in the relevant art(s) may implement the main data converter 402 using a different number of the main ADCs 418.1 through 418.*n* and/or the multiple phases 454.1 through 454.*n* without departing from the spirit and scope of the present invention. Additionally, those skilled in the relevant art(s) will recognize that the multiple phases 454.1 through 454.*n* of the sampling clock may be characterized as having different phase offsets without departing from the spirit and scope of the present invention.

However, unknown offsets between the multiple phases 454.1 through 454.*n* of the sampling clock, as well as other impairments, such as the one or more impairments as described above, may cause the digital output samples 452 to no longer accurately represent the analog input 450. The unknown offsets may cause the main ADCs 418.1 through 418.*n* to sample the analog input 450 at an undesirable instant in time, namely, these unknown offsets may cause the main ADCs 418.1 through 418.*n* to sample the analog input 450 earlier and/or later then intended. As a result, the main digital samples 456.1 through 456.*n*, when recombined as to be discussed below, no longer accurately represent the analog input 450.

FIG. 5A graphically illustrates multiple phases of a sampling clock used in the second composite ADC according to an exemplary embodiment of the present invention. As shown in FIG. 5A, the multiple phases 454.1 through 454.*n* of the sampling clock are characterized as having a substantially similar frequency, but are offset in phase from each other. For example, the frequency of each of the multiple phases 454.1 through 454.*n* of the sampling clock is given by:

$$\frac{f_{NYQ}}{N}, \tag{1}$$

where $f_{NYQ}$ represents a Nyquist frequency of the analog input 450 and N represents a number of the main ADCs 418.1 through 418.*n* within the main data converter 402. The phase offset between the multiple phases 454.1 through 454.*n* of the sampling clock may be characterized as:

$$\frac{2\pi}{N}, \tag{2}$$

where N represents the number of the main ADCs 418.1 through 418.*n* within the main data converter 402. As a result, the main ADCs 418.1 through 418.*n* collectively sample the analog input 450, staggered in time, each at a slower rate than the Nyquist frequency of the analog input 450, but collectively at a rate equal to or surpassing the Nyquist frequency.

FIG. 5B graphically illustrates unknown offsets between multiple phases of the sampling clock used in the second composite ADC according to an exemplary embodiment of the present invention. As shown in FIG. 5B, the multiple phases 454.1 through 454.*n* of the sampling clock are characterized as being offset from optimal phases 550.1 through 550.*n* of the sampling clock. The optimal phases 550.1 through 550.*n* represent optimal phases of the sampling clock that may be used by the main ADCs 418.1 through 418.*n* to sample the analog input 450 at optimal sampling points such that the main digital samples 456.1 through 456.*n* which, when recombined as to be discussed below, most accurately represent the analog input 450. However, unwanted phases offsets $\phi_1$ through $\phi_n$ between the multiple phases 454.1 through 454.*n* of the sampling clock and the optimal phases 550.1 through 550.*n* of the sampling clock may cause the main ADCs 418.1 through 418.*n* to sample the analog input 450 at an undesirable instant in time which may cause the main digital samples 456.1 through 456.n, when recombined, to no longer accurately represent the analog input 450. For example, the unwanted phases offsets $\phi_1$ through $\phi_n$ may cause the main ADCs 418.1 through 418.n to sample the analog input 450 earlier and/or later then intended.

Even though the unwanted phases offsets $\phi_1$ through $\phi_n$ are shown to be a substantially similar unwanted phases offsets, this is for illustrative purposes only. Those skilled in the relevant art(s) will recognize that the unwanted phase offsets $\phi_1$ through $\phi_n$ may be different unwanted phase offsets. For example, some of the unwanted phase offsets $\phi_1$ through $\phi_n$ may represent unwanted negative phase offsets whereby the multiple phases 454.1 through 454.n of the sampling clock lag the optimal phases 550.1 through 550.n of the sampling clock, some of the unwanted phase offsets $\phi_1$ through $\phi_n$ may represent unwanted positive phase offsets whereby the multiple phases 454.1 through 454.n of the sampling clock lead the optimal phases 550.1 through 550.n of the sampling clock, and/or any combination thereof.

Referring back to FIG. 4, the reference re-timing module 404, the reference data converter 406, the compensation module 408, and the estimation module 410 compensate for the unwanted phase offsets $\phi_1$ through $\phi_n$ such that the digital output samples 452 more accurately represent the analog input 450 in the digital signal domain.

The reference re-timing module 404 replicates the multiple phases 454.1 through 454.n of the sampling clock and re-times these replicas on a reference sampling clock 458 to remove unwanted phase offsets, such as the unwanted phase offsets $\phi_1$ through $\phi_n$ to provide an example, between the multiple phases 454.1 through 454.n of the sampling clock to provide a reference phase 460.

An Exemplary Embodiment of a Reference Re-Timing Module Used in the Second Composite ADC FIG. 6A illustrates a block diagram of a reference re-timing module used in the second composite ADC according to an exemplary embodiment of the present invention. FIG. 6B graphically illustrates operation of the reference re-timing module according to an exemplary embodiment of the present invention. As shown in FIG. 6A, a reference re-timing module 600 generates multiple reference phases of the reference sampling clock 458 and re-times one of these multiple reference phases on the reference sampling clock 458 to remove an unwanted phase offset between this multiple reference phase of the reference sampling clock 458 and the reference sampling clock 458 to provide the reference phase 460. The reference re-timing module 600 may represent an exemplary embodiment of the reference re-timing module 400. The reference re-timing module 600 includes a frequency division module 602, a selection module 604, and a re-timing module 606.

As shown in FIG. 6A, the frequency division module 602 divides a frequency of the reference sampling clock 458 by an integer n to provide reference replica phases 652.1 through 652.n. The reference replica phases 652.1 through 652.n represent replicas of the multiple phases 454.1 through 454.n. However, as shown in graphical illustration 690 of FIG. 6B, unlike the unwanted phase offsets $\phi_1$ through $\phi_n$ present in the multiple phases 454.1 through 454.n, the reference replica phases 652.1 through 652.n may be characterized being offset in phase from the reference sampling clock 458 by an unwanted offset $\phi$. In other words, each of the reference replica phases 652.1 through 652.n may be characterized as being offset in phase from the reference sampling clock 458 by the unwanted offset $\phi$.

The selection module 604 selects one of the reference replica phases 652.1 through 652.n to provide a single reference phase 654. The single reference phase 654 may be characterized as being offset in phase from the reference sampling clock 458 by the unwanted offset $\phi$. Typically, each of the reference replica phases 652.1 through 652.n correspond to one of the multiple phases 454.1 through 454.n. The selection module 604 selects the reference replica phase 652.1 through 652.n as the single reference phase 654 that corresponds to the multiple phase 454.1 through 454.n that is being used to convert the analog input 450, namely at the logical one. For example, the selection module 604 selects the reference replica phase 652.1 when the multiple phase 454.1 is at the logical one. In this example, when the multiple phase 454.1 transitions from being the logical one to the logical zero and the multiple phase 454.2 transitions from being the logical zero to the logical one, the selection module 604 likewise transitions from selecting the reference replica phase 652.1 to selecting the reference replica phase 652.2.

The re-timing module 606 re-times the single reference phase 654 on the reference sampling clock 458 to align the single reference phase 654 and the reference sampling clock 458 in phase to provide the reference phase 460. In an exemplary embodiment, the re-timing module 606 may include one or more flip flops, such as one or more D flip flops to provide an example, to re-time the single reference phase 654 on the reference sampling clock 458. As shown in graphical illustration 692 of FIG. 6B, the re-timing module 606 re-times the single reference phase 654 on the reference sampling clock 458 to substantially compensate for the unwanted offset $\phi$ between the reference sampling clock 458 and the single reference phase 654. As a result, the reference sampling clock 458 and the reference phase 460 are characterized as being aligned in phase without any substantial offsets in phase.

Referring back to FIG. 4, the reference data converter 406 includes a reference ADC 416 to convert the analog input 450 from the analog signal domain to the digital signal domain based upon the reference phase 460 to provide reference digital samples 462. Specifically, the reference ADC 416 samples the analog input 450 according to the reference phase 460. The reference ADC 416 converts this sampled representation of the analog input 450 from the analog signal domain to the digital signal domain to provide the reference digital samples 462. Typically, the reference digital samples 462 correspond to one of the main digital samples 456.1 through 456.n. For example, the reference digital samples 462 correspond to the main digital samples 456.1 when the multiple phase 454.1 through 454.n is being, used to convert the analog input 450. Similarly, the reference digital samples 462 correspond to the main digital samples 456.2 when the multiple phase 454.2 is being, used to convert the analog input 450.

The compensation module 408 adjusts the main digital samples 456.1 through 456.n based upon correction parameters 464.1 through 464.n to provide the corrected digital samples 466.1 through 466.n.

An Exemplary Embodiment of a Compensation Module Used in the Second Composite ADC FIG. 7 illustrates a block diagram of a compensation module used in the second composite ADC according to an exemplary embodiment of the present invention. A compensation module 700 includes one or more adaptive equalizers to adjust the main digital samples 456.1 through 456.n. The compensation module 700 adjusts an impulse response of the one or more adaptive equalizers according to the correction parameters 464.1 through 464.n to compensate for effects of impairments resulting from the unwanted phase offsets, as well as the other impairments as described above, present in the main digital samples 456.1 through 456.n. The compensation module 700 may represent an exemplary embodiment of the compensation module 408. The compensation module 700 includes shift registers 702.1 through 702.$n$ and adaptive equalizer modules 704.1 through 704.$n$.

The shift registers 702.1 through 702.$n$ store one or more samples $S_1$ through $S_m$ of the main digital samples 456.1 through 456.$n$ and provide their corresponding first stored sample of the main digital samples 456.1 through 456.$n$, namely sample $S_m$, as uncorrected digital samples 750.1 through 750.$n$. For example, the shift, register 702.1 stores one or more samples $S_{1,1}$ through $S_{1,m}$ of the main digital sample 456.1 and provides the sample $_{S1,m}$ of the main digital sample 456.1 as the uncorrected digital sample 750.1. As another examples, the shift register 702.$n$ stores one or more samples $S_{n,1}$ through $S_{n,m}$ of the main digital sample 456.$n$ and provides the sample $S_{n,m}$ of the main digital sample 456.$n$ as the uncorrected digital samples 750.$n$. The one or more samples $S_1$ through $S_m$ of the main digital samples 456.1 through 456.$n$ may represent one or more bits or one or more symbols of the main digital samples 456.1 through 456.$n$. Alternatively, the shift registers 702.1 through 702.$n$ may provide one or more samples $S_1$ through $S_m$ of the main digital samples 456.1 through 456.$n$ as the uncorrected digital samples 750.1 through 750.$n$.

The shift registers 702.1 through 702.$n$ may be characterized as having m shifting elements; however, those skilled in the relevant art(s) will recognize that the shift registers 702.1 through 702.$n$ may have a different, number of the shifting elements without departing from the spirit and scope of the present invention. The shift registers 702.1 through 702.$n$ store the one or more samples of the main digital samples 456.1 through 456.$n$ by shifting the main digital samples 456.1 though 456.$n$ into the in shifting elements one or more bits or one or more symbols at a time. In an exemplary embodiment, the main digital samples 456.1 through 456.$n$ represent a series of bits arranged in a parallel format to form a parallel symbol. In this exemplary embodiment, the shift registers 702.1 through 702.$n$ may shift each bit of the parallel symbol into the m shifting elements to convert the parallel format to a serial format. Alternatively, the main digital samples 456.1 through 456.$n$ represent a series of bits arranged in a serial format to form a serial symbol. In this exemplary embodiment, the shift registers 702.1 through 702.$n$ shift each bit of the serial symbol into the m shifting elements.

The adaptive equalizer modules 704.1 through 704.$n$ adjust the uncorrected digital samples 750.1 through 750.$n$ based upon the correction parameters 464.1 through 464.$n$ to provide the corrected digital samples 466.1 through 466.$n$. As shown in FIG. 7, each of the correction parameters 464.1 through 464.$n$ includes n sets of equalization coefficients $C_{1 \ldots m}$. However, those skilled in the relevant art(s) will recognize that the n sets of equalization coefficients $C_{1 \ldots m}$ for each of the adaptive equalizer modules 704.1 through 704.$n$ may be similar or different for each of the correction parameters 464.1 through 464.$n$ without departing from the spirit and scope of the present invention.

The adaptive equalizer modules 704.1 through 704.$n$ adjust the uncorrected digital samples 750.1 through 750.$n$ based upon the correction parameters 464.1 through 464.$n$. The adaptive equalizer modules 704.1 through 704.$n$ operate in a substantially similar manner; therefore, only the adaptive equalizer module 704.1 is to be described in further detail.

The adaptive equalizer module 704.1 includes adaptive equalizers 706.1 through 706.$n$ and a combination module 708. However, those skilled in the relevant art(s) will recognize that the adaptive equalizer modules 704.1 through 704.$n$ may each have a different number of the adaptive equalizers 706.1 through 706.$n$ each with a substantially similar or different number of equalization taps without departing from the spirit and scope of the present invention. Typically, each of the adaptive equalizers 706.1 through 706.$n$ is characterized as having m equalization taps to form the adaptive equalizer module 704.1 that is characterized as having n×m equalization taps. The adaptive equalizers 706.1 through 706.$n$ weight or scale each of their corresponding m equalization taps in accordance with their respective set of equalization coefficients $C_{1 \ldots m}$ from among the n sets of equalization coefficients $C_{1 \ldots m}$ within the correction parameter 464.1 to adjust a corresponding one of the uncorrected digital samples 750.1 through 750.$n$ to provide the adjusted digital samples 752.1.

The combination module 708 combines the adjusted digital samples 752.1 through 752.$n$ to provide the corrected digital sample 466.1.

In an exemplary embodiment, the reference ADC 406 is provided the reference phase 460 with a phase roughly corresponding to the multiple phase 454.1 of the sampling clock, and a first set from among the n sets of equalization coefficients $C_{1 \ldots m}$ is adapted. Then, the reference ADC 406 is provided the reference phase 460 with phase roughly corresponding to the multiple phase 454.2 of the sampling clock, and a second set from among the n sets of equalization coefficients $C_{1 \ldots m}$ is adapted. Then, the reference ADC 406 is provided the reference phase 460 with phase roughly corresponding to the multiple phase 454.$n$ of the sampling clock, and an $n^{th}$ set from among the n sets of equalization coefficients $C_{1 \ldots m}$ is adapted. Then, the adaptation may cycle back to correspond to sampling clock 454.1 again.

Referring back to FIG. 4, the estimation module 410 estimates the correction parameters 464.1 through 464.$n$ based upon the reference digital samples 462. The estimation module 410 may generate the correction parameters 464 which minimize an impairment error between the reference digital samples 462 and the corrected digital samples 466.1 through 466.$n$ using the Least Mean Squared (LMS) algorithm, the Recursive Least Squares (RLS) algorithm, the Minimum Mean Squared Error (MMSE) algorithm or any suitable algorithm that yields a result which minimizes an error quantified by some metric, such as a minimum-mean-square error to provide an example, that will be apparent to those skilled in the relevant art(s) without departing from the spirit and scope of the present invention. It should be appreciated that the estimation and compensation of the main digital samples 456.1 through 456.$n$ into the digital output samples 452 is achieved without interruption of the flow of the digital output samples 452, and may continually operate and update, compensating for time-varying impairments, without interruption of the flow of the digital output samples 452.

An Exemplary Embodiment of an Estimation Module Used in the Second Composite ADC FIG. 8 illustrates a block diagram of an estimation module used in the second composite ADC according to an exemplary embodiment of the present invention. An estimation module 800 determines an impairment error between the reference digital samples 462 and the corrected digital samples 466.1 through 466.$n$. The estimation module 800 projects this impairment error onto the main digital samples 456.1 through 456.$n$ to provide the correction parameters 464.1 through 464.$n$. The estimation module 800 includes a first selection module 802, a combination module 804, a second selection module 806, a multiplication module 808, and an accumulation module 810. The estimation module 800 may represent an exemplary embodiment of the estimation module 410.

The first selection module 802 selects one of the corrected digital samples 466.1 through 466.n to provide selected digital samples 850.

The combination module 804 subtracts the reference digital samples 462 and the selected digital samples 850 to provide an impairment error 852.

The second selection module 806 selects one or more samples $S_1$ through $S_m$ from among one of the main digital samples 456.1 through 456.n. to provide selected sampled digital samples 854. Each of the main digital samples 456.1 through 456.n may be parsed into m samples $S_1$ through $S_m$. For example, the main digital sample 456.1 may be parsed into samples $S_{1,1}$ through $S_{1,m}$. As another example, the main digital sample 456.n may be parsed into samples $S_{n,1}$ through $S_{n,m}$.

The multiplication module 808 multiplies the impairment error 852 and the selected sampled digital samples 854 to provide a projected impairment error 856. Typically, the multiplication module 808 multiplies the impairment error 852 corresponding to the selected digital samples 850 with the one or more samples $S_1$ through $S_m$ for each of the main digital samples 456.1 through 456.n before the first selection module 802 selects another one of the corrected digital samples 466.1 through 466.n as the selected digital samples 850.

The accumulation module 810 accumulates the projected impairment error 856 to one of the correction parameters 464.1 through 464.n to update the correction parameters 464.1 through 464.n. As discussed above, each of the correction parameters 464.1 through 464.n includes n sets of equalization coefficients $C_{1 \ldots m}$ for a total of n×n×m equalization coefficients. The n sets of equalization coefficients $C_{1 \ldots m}$ for one of the correction parameters 464.1 through 464.n correspond to the m samples $S_1$ through $S_m$ of the main digital samples 456.1 through 456.n. For example, the n sets of equalization coefficients $C_{1 \ldots m}$ for the correction parameter 464.1 corresponds to the m samples $S_1$ through $S_m$ of the main digital samples 456.1 through 456.n.

The accumulation module 810 selects one of the correction parameters 464.1 through 464.n that corresponds to the corrected digital samples 466.1 through 466.n that is selected by the selection module 802. For example, the accumulation module 810 selects the correction parameter 464.1 when the corrected digital sample 466.1 is selected by the selection module 802. The accumulation module 810 then selects one of the n sets of equalization coefficients $C_{1 \ldots m}$ from among this selected correction parameter 464.1 through 464.n that corresponds to the sample $S_1$ through $S_m$ that is selected by the selection module 806. For example, the accumulation module 810 selects a first set of equalization coefficients $C_{1 \ldots m}$ from among, n sets of equalization coefficients $C_{1 \ldots m}$ when the samples $S_{1,1}$ through $S_{1,m}$ are selected by the selection module 806. The accumulation module 810 then accumulates the projected impairment error 856 for each of the samples $S_1$ through $S_m$ to their corresponding equalization coefficient from among this selected set of equalization coefficients $C_{1 \ldots m}$ to update this selected set of equalization coefficients $C_{1 \ldots m}$.

Exemplary Operation of the Reference Re-Timing Module, the Compensation Module, and the Estimation Module FIG. 9 is a flowchart of exemplary operational steps of the reference re-timing module, the compensation module, and the estimation module according to an exemplary embodiment of the present invention. The invention is not limited to this operational description. Rather, it will be apparent to persons, skilled in the relevant art(s) from the teachings herein that other operational control flows are within the scope and spirit of the present invention. The following discussion describes the steps in FIG. 9.

At step 902, the operational control flow selects a reference phase from among a plurality of reference phases, such as one of the reference replica phases 652.1 through 652.n to provide an example. The operational control flow may generate the plurality of reference phases by dividing a frequency of a sampling clock, such as the reference sampling clock 458 to provide an example, by an integer n.

At step 904, the operational control flow re-times the reference phase from step 902 on the sampling clock from step 902. The operational control flow aligns in phase the reference phase from step 904 with the sampling clock from step 902 to provide a reference phase, such as the reference phase 460 to provide an example.

At step 906, the operational control flow samples an analog input, such as the analog input 450 to provide an example, according to the reference phase from step 904. The operational control flow converts this sampled representation of the analog input from the analog signal domain to the digital signal domain to provide reference digital samples, such as the reference digital samples 462 to provide an example.

At step 908, the operational control flow selects a corrected sample from among a plurality of corrected samples, such as the corrected digital samples 466.1 through 466.n to provide an example, that corresponds to the reference phase from step 902.

At step 910, the operational control flow subtracts the reference digital samples from step 906 and the corrected sample from step 908 to provide an impairment error.

At step 912, the operational control flow selects a sample from among an impaired symbol from a plurality of impaired symbols, such as the main digital samples 456.1 through 456.n to provide an example. The plurality of impaired symbols may be embedded with impairments resulting from unknown offsets between multiple phases of sampling clock that is used to generate convert the analog input from 906 from the analog signal domain to the digital signal domain, as well as other impairments as described above. Each of the plurality of impaired symbols may be characterized as including in samples $S_1$ through $S_m$ of the main digital samples 456.1 through 456.n. The samples $S_1$ through $S_m$ may represent one or more bits or one or more symbols of the plurality of impaired symbols. The operational control flow selects one of the in samples from among the samples $S_1$ through $S_m$ at step 912.

At step 914, the operational control flow multiplies the sample from step 912 and the impairment error from step 910. The operational control flow projects the impairment error from step 910 onto the sample from step 912 to provide a projected impairment error, such as the projected impairment error 856 to provide an example.

At step 916, the operational control flow accumulates the projected impairment error to an equalization coefficient from among a plurality of equalization coefficients to update the equalization coefficient. The plurality of equalization coefficients includes equalization coefficients $C_{1 \ldots m}$ that correspond to one of the samples $S_1$ through $S_m$ from step 912. The operational control flow selects the equalization coefficient $C_{1 \ldots m}$ that corresponds to the samples $S_1$ through $S_m$ from step 912 and accumulates the projected impairment error to this selected equalization coefficient.

At step 918, the operational control flow determines whether all of the equalization coefficients $C_{1 \ldots m}$ from among the plurality of equalization coefficients have been updated. If so, the operational control flow proceeds to step 920. Else, the operational control flow reverts to step 912 to select another sample from samples $S_1$ through $S_m$ to update the equalization coefficients $C_{1 \ldots m}$ that corresponds to this another sample.

At step 920, the operational control flow determines whether all of the corrected samples from among the plurality of corrected samples have been updated. If so, the operational control flow proceeds to step 922. Else, the operational control flow reverts to step 908 to select another corrected sample from among the plurality of corrected samples.

At step 922, the operational control flow selects another reference phase from among the plurality of reference phases. The operational control flow reverts back to step 904.

An Exemplary Embodiment of a Recombination Module Used in the Second Composite ADC Referring back to FIG. 4, the recombination module 412 combines the corrected digital samples 466.1 through 466.$n$ to provide the digital output samples 452. The recombination module 412 may be implemented using any suitable well known means of interleaving to combine the corrected digital samples 466.1 through 466.$n$ to provide the digital output samples 452.

Alternatively, FIG. 10 illustrates a block diagram of a recombination module used in the second composite ADC according to an exemplary embodiment of the present invention. A recombination module 1000 adjusts the connected digital samples 466.1 through 466.$n$ to allow for combination of the corrected digital samples 466.1 through 466.$n$ to provide the digital output samples 452. The recombination module 1000 may represent an exemplary embodiment of the recombination module 412. The recombination module 1000 includes finite impulse response (FIR) filter modules 1002.1 through 1002.$n$, an interleaving module 1004, and a coefficient update module 1006.

The FIR filter modules 1002.1 through 1002.$n$ adjust the corrected digital samples 466.1 through 466.$n$ based upon FIR coefficients 1054 to provide adjusted corrected digital samples 1052.1 through 1052.$n$. In an exemplary embodiment, the FIR filter modules 1002.1 through 1002.$n$ adjust a phase of the corrected digital samples 466.1 through 466.$n$ such that the adjusted corrected digital samples 1052.1 through 1052.$n$ are aligned in phase.

The interleaving module 1004 interleaves the adjusted corrected digital samples 1052.1 through 1052.$n$ to provide the digital output samples 452. In other words, the interleaving module 1004 converts the adjusted corrected digital samples 1052.1 through 1052.$n$ from a parallel representation of the analog input 150 into a serial representation.

The coefficient update module 1006 provides the FIR coefficients 1054 based upon the digital output samples 452. The coefficient update module 1006 may generate the FIR coefficients 1054 using the Least Mean Squared (LMS), Recursive Least Squares (RLS), Minimum Mean Squared Error (MMSE) algorithms or any suitable algorithm that yields a result which minimizes an error quantified by some metric, such as a minimum-mean-square error to provide an example, that will be apparent to those skilled in the relevant art(s) without departing from the spirit and scope of the present invention.

Conclusion

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A composite analog-to-digital converter (ADC) for converting an analog input to a digital output, comprising:
   a main data converter configured to convert the analog input to provide main digital samples, the main data converter having an impairment;
   a reference data converter configured to convert the analog input to provide reference digital samples, the reference data converter not being impaired by the impairment; and
   a correction module configured to:
      quantify the impairment according to a model,
      determine a solution to the model to provide a correction parameter, and
      adjust the main digital samples based upon the correction parameter to compensate for the impairment to provide the digital output.

2. The composite ADC of claim 1, wherein the reference data converter has a second impairment that is different from the impairment.

3. The composite ADC of claim 1, wherein the reference data converter is further configured to sample the analog input at a different sampling rate or resolution than at which the main data converter samples the analog input.

4. The composite ADC of claim 3, wherein the correction module is further configured to align the main digital samples and the reference digital samples in time.

5. The composite ADC of claim 1, wherein the correction module comprises:
   an estimation module configured to:
      map one or more main digital samples from among the main digital samples and one or more reference digital samples from among the reference digital samples onto a coordinate system to develop the model, and
      determine the solution to the model based upon a statistical relationship between the one or more mapped main digital samples and the one or more mapped reference digital samples; and
   a compensation module configured to adjust the main digital samples based upon the correction parameter to provide the digital output.

6. The composite ADC of claim 5, wherein the coordinate system comprises: a Cartesian coordinate system.

7. The composite ADC of claim 5, wherein the compensation module comprises:
   an adaptive filter configured to adapt its impulse response by updating an adaptive filtering coefficient in response to the correction parameter.

8. The composite ADC of claim 5, wherein the model comprises:
a difference equation with an unknown parameter, the solution of the model representing a solution for the unknown parameter.

9. The composite ADC of claim 5, wherein the statistical relationship comprises:
a line of best fit between the one or more mapped main digital samples and the one or more mapped reference digital samples;
a quadric polynomial of best fit between the one or more mapped main digital samples and the one or more mapped reference digital samples; or
a cubic polynomial of best fit between the one or more mapped main digital samples and the one or more mapped reference digital samples.

10. A composite analog-to-digital converter (ADC) for converting an analog input to a digital output, comprising:
a main data converter configured to convert the analog input to provide main digital samples;
a reference data converter configured to convert the analog input to provide reference digital samples; and
a correction module configured to:
map one or more main digital samples from among the main digital samples and one or more reference digital samples from among the reference digital samples on a coordinate system,
determine a statistical relationship between the one or more mapped digital samples and the one or more mapped reference digital samples,
determine a solution to a model of an impairment based upon the statistical relationship, and
adjust the main digital samples based upon the solution to compensate for the effect of the impairment to provide the digital output.

11. The composite ADC of claim 10, wherein the coordinate system comprises:
a Cartesian coordinate system.

12. The composite ADC of claim 10, wherein the correction module comprises:
an adaptive filter configured to adapt its impulse response by updating an adaptive filtering coefficient in response to the solution.

13. The composite ADC of claim 10, wherein the statistical relationship comprises:
a line of best fit between the one or more mapped main digital samples and the one or more mapped reference digital samples;
a quadric polynomial of best fit between the one or more mapped main digital samples and the one or more mapped reference digital samples; or
a cubic polynomial of best fit between the one or more mapped main digital samples and the one or more mapped reference digital samples.

14. The composite ADC of claim 10, wherein the main data converter is configured to convert the analog input at a first rate to provide the main digital samples, and
wherein the reference data converter is configured to convert the analog input at a second rate that is different from the first rate to provide the reference digital samples.

15. The composite ADC of claim 14, wherein the correction module is further configured to interpolate or average between samples of the digital samples to align in time the reference digital samples and the adjusted main digital samples.

16. A method for converting an analog input to a digital output, comprising:
converting, by a composite analog-to-digital converter (ADC), the analog input to provide main digital samples;
converting, by the composite ADC, the analog input to provide reference digital samples;
mapping, by the composite ADC, one or more main digital samples from among the main digital samples and one or more reference digital samples from among the reference digital samples on a coordinate system:
determining, by the composite ADC, a statistical relationship between the one or more mapped digital samples and the one or more mapped reference digital samples,
determining, by the composite ADC, a solution to a model of an impairment based upon the statistical relationship; and
adjusting, by the composite ADC, the main digital samples based upon the solution to compensate for the impairment to provide the digital output.

17. The method of claim 16, wherein the mapping comprises:
mapping the one or more main digital samples and the one or more reference digital samples as one or more points on a Cartesian coordinate system to develop the model.

18. The method of claim 16, wherein the adjusting comprises:
adapting an impulse response of the composite ADC by updating an adaptive filtering coefficient in response to the solution.

19. The method of claim 16, wherein the determining the statistical relationship comprises:
determining:
a line of best fit between the one or more mapped main digital samples and the one or more mapped reference digital samples;
a quadric polynomial of best fit between the one or more mapped main digital samples and the one or more mapped reference digital samples; or
a cubic polynomial of best fit between the one or more mapped main digital samples and the one or more mapped reference digital samples.

20. The method of claim 16, wherein the converting the analog input to provide the main digital samples comprises:
converting the analog input at a first rate to provide the main digital samples, and
wherein the converting the analog input to provide the reference digital samples comprises:
converting the analog input at a second rate that is different from the first rate to provide the reference digital samples.

* * * * *